(12) United States Patent
Charlton et al.

(10) Patent No.: US 9,351,419 B2
(45) Date of Patent: May 24, 2016

(54) SAFETY DEVICE FOR PROJECTOR SUPPORT ARM FOR AN INTERACTIVE DISPLAY SYSTEM

(75) Inventors: John Charlton, Lancashire (GB); David Woodcock, Lancashire (GB); Howard Gallimore, Lancashire (GB)

(73) Assignee: Promethean Limited (GB)

( * ) Notice: Subject to any disclaimer, the term of this patent is extended or adjusted under 35 U.S.C. 154(b) by 461 days.

(21) Appl. No.: 13/819,024

(22) PCT Filed: Aug. 26, 2011

(86) PCT No.: PCT/EP2011/064706
§ 371 (c)(1),
(2), (4) Date: Jun. 4, 2013

(87) PCT Pub. No.: WO2012/025614
PCT Pub. Date: Mar. 1, 2012

(65) Prior Publication Data
US 2014/0146508 A1    May 29, 2014

(30) Foreign Application Priority Data

Aug. 26, 2010  (GB) .................................. 1014278.4

(51) Int. Cl.
*F16M 11/10* (2006.01)
*H05K 7/14* (2006.01)
(Continued)

(52) U.S. Cl.
CPC ................ *H05K 7/14* (2013.01); *F16M 11/10* (2013.01); *F16M 13/02* (2013.01); *F16M 13/027* (2013.01); *G03B 21/10* (2013.01); *G03B 21/54* (2013.01); *G06F 3/0425* (2013.01)

(58) Field of Classification Search
CPC ....... F16M 11/04; F16M 11/08; F16M 11/10; F16M 11/12; F16M 2200/06; F16M 13/02; F16M 13/027; G03B 21/10; G03B 21/54; G06F 3/0425; H05K 7/14
USPC ................................ 248/371, 372.1; 361/807
See application file for complete search history.

(56) References Cited

U.S. PATENT DOCUMENTS 4,720,204 A    1/1988  Johnson
5,624,173 A *  4/1997  Davidson ...................... 353/119
(Continued)

FOREIGN PATENT DOCUMENTS

WO    WO 2007/023246 A1    3/2007

OTHER PUBLICATIONS

International Preliminary Report on Patentability for International (PCT) Patent Application No. PCT/EP2011/064706, mailed Mar. 7, 2013, 8 pages.
(Continued)

*Primary Examiner* — Bao-Luan Le
(74) *Attorney, Agent, or Firm* — Brient Globerman, LLC; Kyle M. Globerman

(57) ABSTRACT

There is disclosed an interactive whiteboard system including a display surface (102) and a projector (108), wherein a support structure includes a support arm (110) which extends away from the plane of the interactive surface to support a projector head of the projector in a position in front of the display surface, wherein there is further provided a safety member (212) for connecting the support arm to the support structure, the safety member being arranged such that in an overload condition of the support arm, the support arm pivots relative to the support structure in a controlled manner until a predetermined stop point is reached.

13 Claims, 5 Drawing Sheets

(51) Int. Cl.
*F16M 13/02* (2006.01)
*G03B 21/10* (2006.01)
*G03B 21/54* (2006.01)
*G06F 3/042* (2006.01)

(56) References Cited

U.S. PATENT DOCUMENTS

| | | | |
|---|---|---|---|
| 6,082,552 A * | 7/2000 | Pollock et al. | 211/18 |
| 6,540,366 B2 * | 4/2003 | Keenan et al. | 353/79 |
| 6,604,829 B2 * | 8/2003 | Rodriguez, Jr. | 353/79 |
| 6,732,988 B2 * | 5/2004 | Ihalainen et al. | 248/276.1 |
| 6,736,516 B1 * | 5/2004 | Kepley et al. | 353/79 |
| 7,537,184 B1 * | 5/2009 | Basilicato et al. | 248/123.11 |
| D598,945 S * | 8/2009 | Gillespie | D16/235 |
| D608,113 S * | 1/2010 | Koh | D6/682 |
| 7,673,840 B2 * | 3/2010 | Weber et al. | 248/292.13 |
| D626,763 S * | 11/2010 | Koh | D6/681.1 |
| 7,832,694 B2 * | 11/2010 | German et al. | 248/125.8 |
| 7,942,372 B2 * | 5/2011 | Koh | 248/125.8 |
| 8,359,982 B2 * | 1/2013 | Lebel et al. | 108/44 |
| 2002/0131024 A1 * | 9/2002 | Keenan et al. | 353/79 |
| 2003/0123032 A1 * | 7/2003 | Rodriguez, Jr. | 353/74 |
| 2004/0085520 A1 * | 5/2004 | Kepley et al. | 353/79 |
| 2004/0212785 A1 * | 10/2004 | Kepley et al. | 353/79 |
| 2005/0270497 A1 * | 12/2005 | Kepley et al. | 353/79 |
| 2006/0148598 A1 * | 7/2006 | Mahoney | 473/481 |
| 2007/0171383 A1 * | 7/2007 | Deves | 353/79 |
| 2008/0079908 A1 * | 4/2008 | Choi | 353/79 |
| 2008/0137040 A1 * | 6/2008 | Rodriguez et al. | 353/79 |
| 2008/0142667 A1 * | 6/2008 | German et al. | 248/447.1 |
| 2008/0316438 A1 * | 12/2008 | Midorikawa | 353/70 |
| 2009/0015798 A1 * | 1/2009 | Unsworth | 353/79 |
| 2009/0173856 A1 * | 7/2009 | Auger et al. | 248/222.52 |
| 2009/0173867 A1 * | 7/2009 | Auger et al. | 248/548 |
| 2010/0006717 A1 * | 1/2010 | Weber et al. | 248/125.2 |
| 2010/0006732 A1 * | 1/2010 | Weber et al. | 248/372.1 |
| 2010/0155563 A1 * | 6/2010 | Koh | 248/449 |

OTHER PUBLICATIONS

International Search Report prepared by the European Patent Office on Nov. 24, 2011, for International Application No. PCT/EP2011/064706.

Written Opinion of the International Searching Authority prepared by the European Patent Office on Nov. 24, 2011, for International Application No. PCT/EP2011/064706.

Search Report prepared by the Intellectual Property Office of Great Britain for Great Britain Application No. GB1014278.4 on Sep. 21, 2010.

* cited by examiner

SAFETY DEVICE FOR PROJECTOR SUPPORT ARM FOR AN INTERACTIVE DISPLAY SYSTEM

CROSS REFERENCE TO RELATED APPLICATIONS

This application is a national stage application under 35 U.S.C. 371 and claims the benefit of PCT Application No. PCT/EP2011/064706 having an international filing date of Aug. 26, 2011, which designated the United States, which PCT application claimed the benefit of Great Britain Application No. 1014278.4 filed 26 Aug. 2010, the disclosures of each of which are incorporated herein by reference.

BACKGROUND TO THE INVENTION

1. Field of the Invention

The present invention relates to an interactive whiteboard system including a support structure, a display surface, and a projector, wherein the support structure is preferably adapted to support the display surface, and wherein the support structure further includes a support arm which extends away from the plane of the display surface to support a projector head of the projector in a projection position in front of the interactive surface.

2. Description of the Related Art

A typical example of a system incorporating an interactive display surface is an interactive (or electronic) whiteboard system. An electronic whiteboard system typically is adapted to sense the position of a pointing device or pointer relative to a work surface (the display surface) of the whiteboard, the work surface being an interactive display surface. When an image is displayed on the work surface of the whiteboard the pointer can be used in the same way as a computer mouse to manipulate objects on the display by moving a pointer over the surface of the whiteboard.

Interactive display systems, such as interactive whiteboards, are well-known in the art.

A typical prior art arrangement has required a projector to be installed in the ceiling of a room, at a suitable distance from the interactive display surface onto which the images are projected from the projector.

The advent of so-called short-throw projector technology has allowed for the projector to be positioned much closer to the interactive surface, such that an integrated interactive display system is possible. Such an integrated interactive display system typically is provided with a support arm extending from the plane of the interactive surface, and for example attached to a wall or support frame on which the interactive surface is mounted. The projector may then be mounted at the end of the support arm at a distance from the interactive surface.

The provision of such integrated interactive display systems has introduced problems which were not encountered in traditional integrated display system implementations. The provision of the support arm introduces a point of mechanical failure which was not previously present. In particular, a problem potentially arises in individuals applying force to the support arm, for example by applying their weight to the support arm (e.g. swinging on the support arm). This can result in the mechanical failure of the support arm, or the support frame to which it is attached, causing the support arm to break, the frame to break, or the integrated display system generally to be damaged. Further, the wall or structure to which the integrated interactive display system is attached may be damaged due to the absorption of any downward force applied to the end of the boom arm. In such case there is also the possibility of the projector equipment which the support arm supports falling to the ground and also breaking. In addition, the individual applying the forces, or an individual located proximate the interactive display system, could be injured.

For this reason, there is a desirability to ensure that in the event of 'breaking' forces applied to the support arm, this does not result in a mechanical failure which results in the arm and/or the projector falling to the ground, or the whole integrated system falling to the ground then causing further damage either of the system, the projector, or the surrounding environment, or of damaging the wall or supporting structure, or of injuring individuals who may be below the support arm.

It is an object of the invention to provide an improvement to an integrated interactive display system.

SUMMARY OF THE INVENTION

The invention provides an interactive whiteboard system including a display surface and a projector, wherein a support structure includes a support arm which extends away from the plane of the interactive surface to support a projector head of the projector in a position in front of the display surface, wherein there is further provided a safety member for connecting the support arm to the support structure, the safety member being arranged such that in an overload condition of the support arm, the support arm pivots relative to the support structure in a controlled manner until a predetermined stop point is reached.

The safety member may be provided with a point of weakness at the position where it joins the support arm to the support structure, which point of weakness breaks in the overload condition.

The safety member may comprise a tubular structure, the point of weakness being provided by a saw-cut to a portion thereof. A portion of the tubular structure opposite the point of weakness may provide a hinge in the overload condition. The point of weakness may be provided at an upper surface of the tube, and the hinge is provided at a lower surface of the tube.

One end of the tube may be connected to the support structure and the other end of the tube may be connected to the support arm, wherein in the overload condition the point of weakness breaks such that the portion of the tube connected to the support arm pivots about the hinge downwardly, and the support arm connected thereto pivots downwardly.

The safety member may be provided with opposing abutment edges about the point of weakness, wherein in the overload condition one portion of the safety member pivots relative to another portion of the safety member until the opposing abutment edges engage, the engagement of the abutment edges defining a stop condition.

The first and second abutment edges may be disposed at an angle with respect to each other, the angle defining the range of movement of the support arm in the overload condition. The first abutment edge may be horizontal, and the second abutment edge may be at an angle to the horizontal, the angle defining the range of movement of the support arm in the overload condition.

A pair of opposing abutment edges may be provided on either one or both sides of the tube wherein in a non-overload condition the opposing edges are separated, and in the overload condition the opposing edges move toward each other about the hinge and engage in a stop position, wherein the stop position defines the final position of the support arm in the overload condition.

In an overload condition the point of weakness breaks as a result of a break in the material of the tubular structure.

In an overload condition, as the support arm pivots about the hinge, the sidewalls of the tubular structure tear in a line between the point of weakness on the upper surface and the hinge on the lower surface.

The safety member may comprise a part of the support arm.

The support structure may comprise a frame having a portion for connecting to the safety member, such that the safety member joins the frame to the support arm.

The frame may include a further support arm which extends away from the plane of the interactive surface, the safety member joining the support arm and the further support arm.

The support structure may include a mounting structure for connecting the safety member to a wall such that the safety member joins the support arm to the wall.

BRIEF DESCRIPTION OF THE FIGURES

The invention will now be described by way of example with reference to the accompanying figures, in which.

DESCRIPTION OF THE PREFERRED EMBODIMENTS

Figure 1:
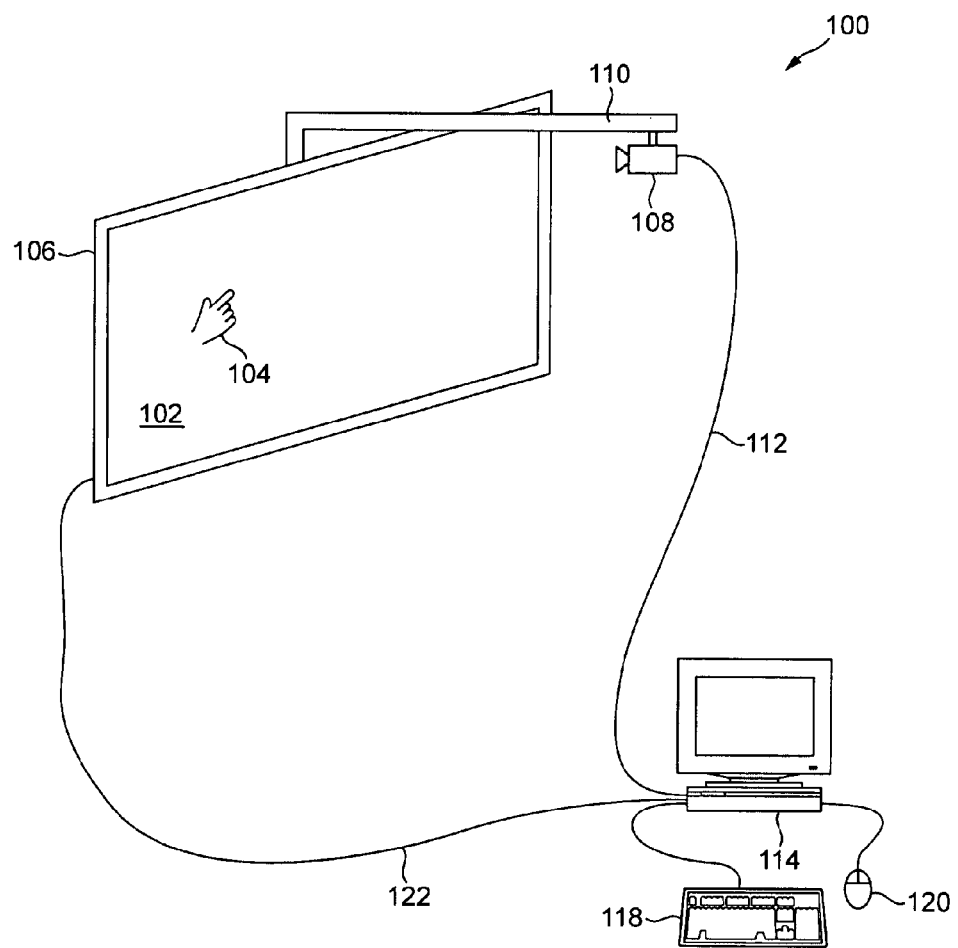
FIG. 1 illustrates an exemplary arrangement of a typical integrated interactive display system.

The invention is now described by way of reference to various examples, embodiments, and advantageous applications. One skilled in the art will appreciate that the invention is not limited to the details of any described example, embodiment or detail. In particular the invention is described with reference to an exemplary interactive display system comprising an interactive whiteboard. One skilled in the art will appreciate that the principles of the invention are not limited to such a specific described interactive display system.

A typical application of an interactive whiteboard system is in a teaching environment. The use of interactive whiteboard systems improve teaching productivity and also improve student comprehension. Such interactive whiteboards also allow use to be made of good quality digital teaching materials, and allow data to be manipulated and presented using audio visual technologies.

A typical construction of an exemplary interactive whiteboard system comprises an interactive display surface forming the interactive whiteboard, a projector for projecting images onto the interactive display surface, and a computer system in communication with the interactive whiteboard for generating the images for projection, running software applications associated with such images, and for processing data received from the interactive display surface associated with pointer activity, such as the location of the pointer on the interactive display surface. In this way the computer system can control the generation of images to take into account the detected movement of the pointer on the interactive display surface.

In known systems the pointer can be provided as a specially adapted pen, to interact with an interactive display surface which is provided with appropriate input detection technology. The pen and the interactive display surface may interact by electromagnetic means. Other techniques for detecting a pointer position on an interactive surface are known, such as touch sensing technology (to sense a finger input) rather than a pen input. The present invention is not limited in its applicability to any particular input detection technology incorporated in an interactive display surface. The term pointer used herein incorporates a physical device such as a pen, and a user's finger.

Still further, the invention is not limited to interactive display systems incorporating a display surface which is adapted to be an interactive display surface. Other interactive display systems are known incorporating a display surface, in which the position of a pointer on a surface is detected without the provision of an interactive surface. Camera-based technology, for example, allows the position of a pointer (pen or finger) to be located on a display surface, without the display surface itself being specially adapted to detect inputs. The cameras are positioned at the edges of the display surface to detect the location and movement of a pointer, as known in the art. Another example of a pointer-position technology in which the display surface is not interactive, i.e. not adapted to detect an input at the surface, uses infra-red technology with a specially adapted infra-red pen to detect the position of the pointer on the display surface. Thus an interactive display system may incorporate an interactive display surface, or a display surface in combination with input detection technology associated therewith. The surface of the latter in combination with the input detection technology may nevertheless be described, in some art, as an interactive display surface.

With reference to FIG. 1, an exemplary integrated interactive display system 100 with reference to which the invention is described comprises: an interactive whiteboard assembly arrangement generally designated by reference numeral 106, and including an interactive display surface 102; a projector 108; and a computer system 114. The projector 108 is attached to a support arm or boom 110, which extends in a direction away from the surface of the interactive whiteboard 106, typically in a direction perpendicular to the plane of the interactive whiteboard. One end of the support arm 110 supports the projector 108 in a position in front of the display surface 102, and the other end of the support arm 110 is fixed to the whiteboard 106 or near the whiteboard, such as a frame associated with the whiteboard 106, or a wall on which the whiteboard 106 is mounted.

The interactive display system may be mounted on a fixed structure such as a classroom wall. In such an arrangement a frame or suitable mechanical arrangement may connect the interactive whiteboard 106 to the wall. The support arm 110 may connect directly to the fixed structure (e.g. the wall), or connect to the frame or suitable mechanical arrangement, or connect to the interactive whiteboard 106. The interactive display system may, alternatively, be mounted to a portable or mobile structure such as a stand. In such an arrangement a frame or suitable mechanical arrangement may connect the interactive whiteboard 106 to the stand. The support arm 110 may connect directly to the stand, or connect to the frame or suitable mechanical arrangement, or connect to the interactive whiteboard 106. In general, the support arm 110 connects to a support structure of the interactive display system. The present invention may be implemented in any of these described arrangements of an interactive display system.

The operation of the interactive display system 100 is not relevant to the present invention, and the operation of such system will be well-understood by one skilled on the art. However, in brief, the computer 114 controls the interactive display system. A computer display 116 is associated with the computer 114. The computer 114 is additionally provided with a keyboard input device 118 and a mouse input device 120. The computer 114 is connected to the interactive whiteboard 106 by communication line 122 to receive input data from the interactive display surface 102, and is connected to the projector 108 by a communication link 112 in order to provide display images to the projector 108. Although in FIG. 1 these are shown as wired connections, they also may be implemented as wireless connections. Shown in FIG. 1 is a pointing device 104, which is used to provide inputs at the interactive display surface 102. The pointing device 104 is illustrated as a finger of a hand. The invention is not limited in its applicability to any particular input detection technology as noted above. As is known in the art, the computer 114 controls the interactive display system to project images via the projector 108 onto the interactive display surface 102. The position of the pointing device 104 is detected by the interactive display surface 102, data returned to the computer 114, and location information determined by the computer 114. The pointing device 104 operates in the same way as a mouse to control the displayed images.

With reference to FIGS. 2 to 6 there is illustrated and described an exemplary implementation of the support arm 110 of FIG. 1, in accordance with a preferred embodiment of the invention. The implementation as illustrated in FIGS. 2 to 6 incorporates the principles of the present invention, and also incorporates details of an exemplary implementation which are not part of the invention. It will be clear from the following description as to which elements shown in FIGS. 2 to 6, are essential to the invention, and which elements are mechanical features of the support arm 110 which are not associated with the invention in a limiting way.

Figure 2:
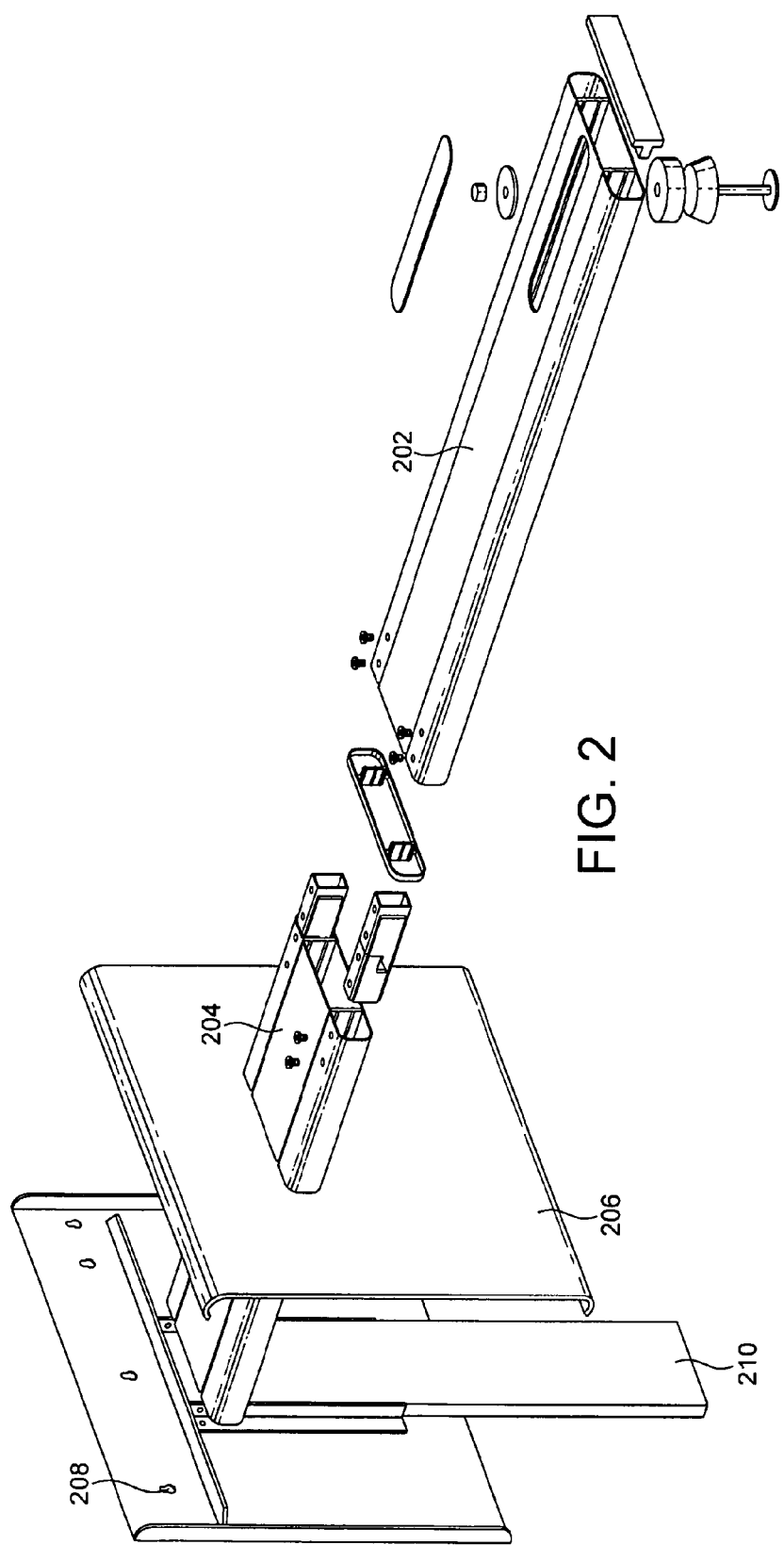
FIG. 2 illustrates an exemplary structure of a support arm for an integrated interactive display system.

In general, the support arm of the preferred embodiment as shown in FIG. 2 includes a first elongated portion 204 and a second elongated portion 202. The first and second elongated portions 204 and 202 are joined or connected by a safety member as will be described further hereinbelow. As illustrated in FIG. 2, there is provided a front face plate 206 through which the first elongated portion of the support arm 204 extends, and a rear face plate 208 which is provided at the rear of the system. Reference numeral 210 identifies a plastic conduit for cables. The rear face plate 208 may be fixably attached to a wall for wall mounting in the integrated display system. One end of the first elongated portion 204 of the support arm is connected to the rear face plate such that it is secured to the wall. The rear face plate 208 is provided for fixing or anchoring of the support arm to the wall. The front face plate 206 may be provided in order to hide the joining of various mechanical elements of the system at the point where the support arm is fixably attached to the wall. The joining of the support arm to a wall is outside the scope of the present invention.

Thus in the described embodiment there is presented an arrangement where the support arm is connected to a wall. As noted above, however, in alternative arrangements the support arm may be connected to other parts of the integrated interactive display system in a wall-mounted or stand-alone (e.g. mobile) arrangement.

In the described embodiments the support arm is described as comprising of two parts, namely the two elongate elements 204 and 202, joined by the safety member. However in alternative arrangements, as will be apparent from the following discussion, the safety member may connect a support arm having one part, such as a single elongate portion, directly to a supporting structure, such as a frame forming part of the integrated interactive display system, or a wall onto which the integrated interactive display system is attached.

Figure 3:
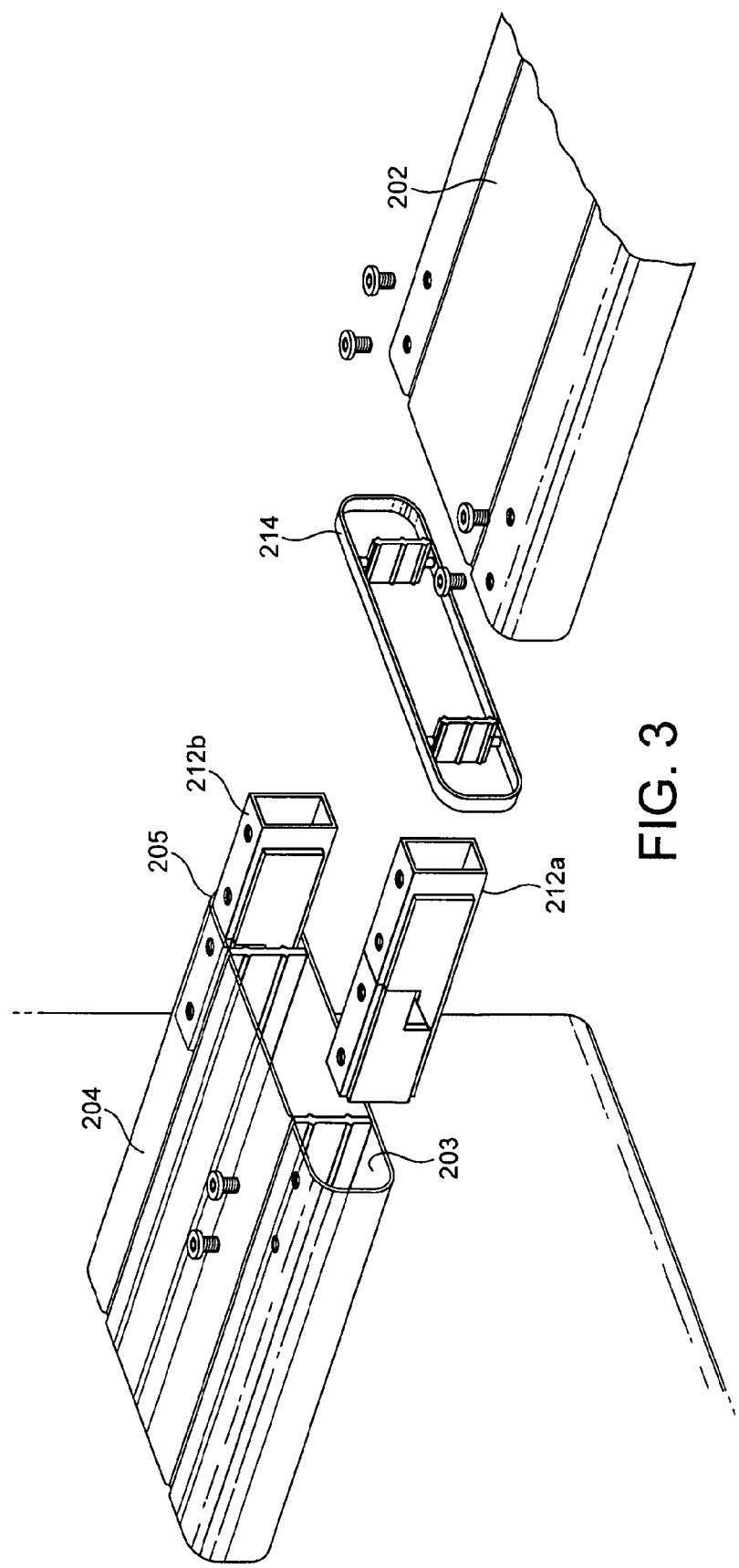
FIG. 3 illustrates the connection of a safety member according to an embodiment of the invention within the support arm of the exemplary integrated interactive display system.

With reference to FIG. 3, a closer view of the safety member joining the first 204 and second 202 elongate members of the support arm is illustrated. The support arm preferably comprises a two-piece extrusion (the elongate members 204 and 202) connected by an overload failure device, i.e. the safety member. Each part of the two-piece extrusion preferably comprises a single drawn piece of metal.

As illustrated in FIG. 3, the elongate portions 204 and 202 of the support arm generally provide two parallel channels, each for receiving one end of a respective safety member, within parallel edges thereof. The channels of the elongated member 204 are identified by reference numerals 203 and 205. The elongated member 202 is provided with similar, complimentary channels. One side of the elongated members 204 and 206 form one complimentary pair of channels, and the other side of the elongated members 204 and 202 form another complimentary pair of channels. When the elongated members 204 and 202 are brought together, to form a joined elongated structure, the channels of each complimentary pair face each other. Each channel in each of the elongate portion 204 and 202 is adapted to receive an elongate safety member denoted by reference numeral 212. A safety member 212*a* is provided for one of the pairs of channels, and a safety member 212*b* is provided for another of the channels.

In general, a single safety member may be provided to join two parts of the support arm. The invention does not require two safety members, nor the specific support arm structure illustrated.

Also shown in FIG. 3 is an alignment gasket 214 which allows accurate connection of the elongated portions of the support arm and the safety members. The safety members are preferably rigidly fixed to both parts of the support arm. Each safety member 212 is preferably elongated. One end of the elongated safety member engages with the channel of the first elongated member 204, and another end of the elongated safety engages with the channel of the second elongated member 202. The engagement of the ends of the safety member with the channels of the first and second elongated members may comprise the ends of the safety members being located within the channels. Half the length of the safety member may be accommodated within each channel, such that the ends of the elongated members 204 and 202 abut when the safety member is in position. With the safety member in position, it may be fixed to the elongated members, e.g. by screw fittings as shown in FIG. 3.

Figure 4:
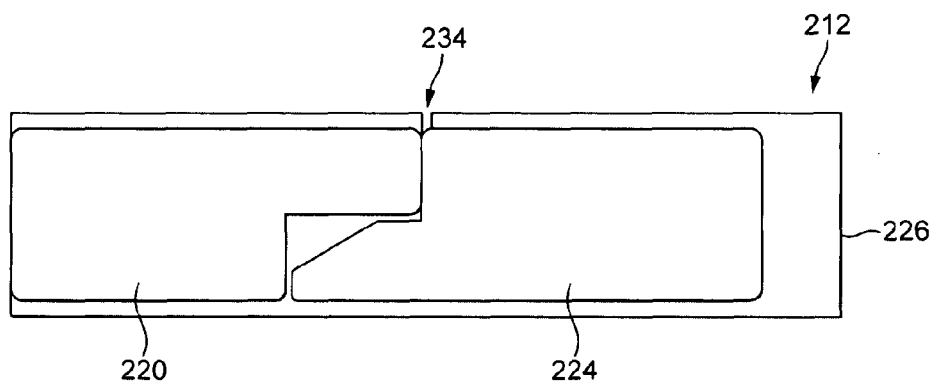
FIG. 4 illustrates a side view of the safety member according to an embodiment of the invention as shown in FIG. 3.
Figure 5:
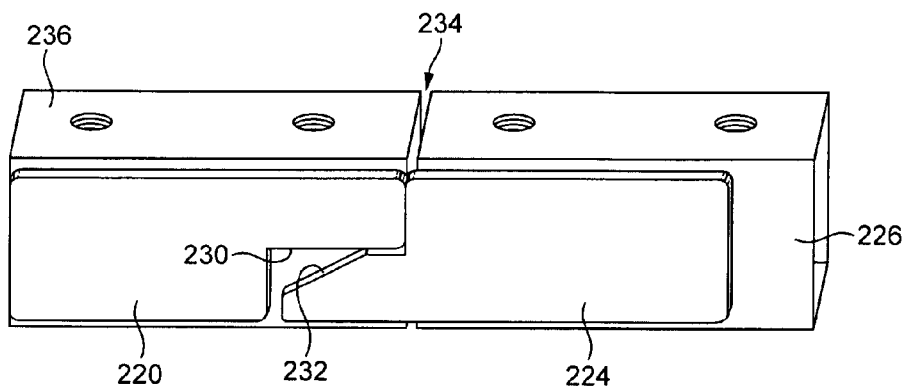
FIG. 5 illustrates a perspective view of the safety member according to an embodiment of the invention as shown in FIG. 3.

A more detailed view of the safety member is now illustrated in FIGS. 4 and 5.

The elongated safety member 212 preferably comprises a tube 226. As will be apparent from the above description, the physical arrangement of the safety member 212 is designed to mechanically engage with the parts of the support arm. The tube 226 of the elongated safety member 212 preferably comprises a top surface, a bottom surface, and two side walls adjoining at the top and bottom surfaces. The tube 226 is rigid in normal loading conditions. A portion 234 of the top surface of the tube between the side walls is preferably weakened, and a portion of the side walls adjacent the top surface and adjoining said weakened portion 234 is also preferably weakened.

The weakened area is preferably at the half-way point along the length of elongated safety member 212. With the safety member 212 in position, joining the two elongated portions of the support arm together, the weakened portion is preferably located to coincide with the position of the safety member where the two elongated portions join. The weakened area provides a point of predictable failure in an overload condition. The weakened portion may be provided by a saw-cut on the upper surface.

One or both of the side walls is provided with two wedge portions, a first wedge portion 220 and a second wedge portion 224. The wedge portions 220 and 224 comprise stop plates. The wedge portions 220 and 224 are provided with respective opposing abutment edges around the weakened portion 234. As can be seen in FIG. 5, the wedge portion 220 has an abutment edge 232 which is generally, in a normal loading condition, horizontal. The wedge portion 224 has an abutment edge 230 which is generally, in a normal loading condition at an angle to the horizontal. The abutment edges 232 and 230 face each other, such that an angle is defined between the abutment edge 230 and the horizontal abutment edge 232. The angle defines the range of movement of the support arm in the overload condition. In general, the respective abutment edges are positioned such that they form an angle with respect to each other, arrangements not being limited to the edge 232 being horizontal.

On application of a force at the end of the support arm to which the projector is attached exceeding a threshold, i.e. an abnormal loading condition, the weakened portion 234 on the upper surface results in the two parts of the upper surface 236 beginning to separate, following which the weakened portions on each of the side walls begin to separate such that the safety member is effectively split at the top thereof, with one portion thereof being pulled from the other portion thereof. The bottom surface of the safety member remains joined, acting as a hinge as the top surface and the sidewalls split.

Figure 6:
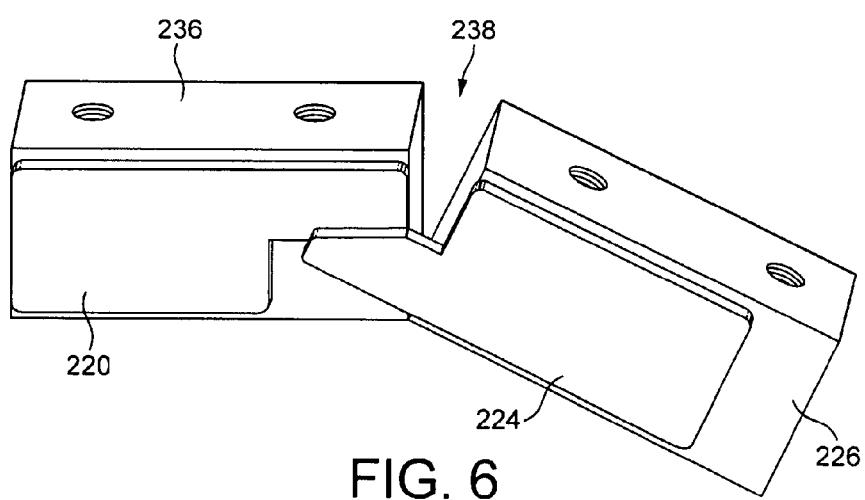
FIG. 6 illustrates a perspective view of the safety member according to an embodiment of the invention as shown in FIG. 3 in an arrangement where the mechanical structure of the support arm has been overloaded.

FIG. 6 illustrates the safety member following an abnormal or overload condition. Following the overload condition, an opening 238 is formed along the upper surface and side walls of the safety member. As is further illustrated in FIG. 6, one portion of the safety member moves relative to the other portion of safety member until the abutment edges 230 and 232 engage. Thus the respective portions of the safety member move relative to each other by the angle defined by the angle between the edges 230 and 232 in a normal loading condition in FIG. 5. Following movement through such angle, further movement is stopped.

The positioning of the safety member 212 relative to the two elongated portions 204, 202 of the support arm 110 is such that the first elongated portion is attached to one portion of the safety member and the other elongated portion is attached to the other portion of the safety member, such that the safety member joins the two portions together. The weakened part of the safety member is located at the join between the first and second elongated portions of the support arm. Thus as the safety member moves apart, one portion of the support arm moves apart relative to the other portion of the support arm. Thus the part of the support arm which is attached to the projector, at which the overload condition applies, moves downwardly while the other part of the support arm is unmoved. The downward movement of the part of the support arm corresponds to the movement of one part of the safety member to the other part, about a hinge provided by the bottom surface of the safety member.

As noted above, there is no requirement for the support arm to have two portions joined by the safety member. One portion of the safety member may in fact be attached directly to a supporting structure, such that the support arm moves relative to the supporting structure. Such supporting structure may be a wall, a frame, or the interactive display itself.

The safety member connects the support arm to the support structure. The support arm is connected to the support structure solely by the safety member. The safety member, in a non-overload condition, comprises part of the support arm. The break of the safety member is a break of the support arm. The break of the safety member is not a complete break: the safety member partially breaks to maintain a connection between the support arm and the support structure. The break of the safety member causes the connection to the support arm to the support structure to partially break, such that the support arm pivots about the safety member.

Thus in an integrated interactive display system having a support arm to physically hold a projector in a projection position in front of a display, there is provided a safety member. The safety member has a predefined, predictable point of weakness, which can break upon an excessive pressure as a result of an overload condition applied to the support arm. The point of weakness is on the support arm itself: i.e. the safety member effectively results in the support arm itself breaking. The support arm preferably, however, remains attached to the support structure.

A control mechanism is provided within the safety member for controlling the break following an overload condition such that the fall of the support arm is controlled and not sudden.

A stop to prevent the support arm from extending beyond a certain point following the overload condition, and a damped fall, is provided by the safety member. A separate independent physical stop is not required to end the fall. There is no requirement to provide an independent specific means to control the fall of the arm.

Following an overload condition, the safety member 212 can be replaced, and the original support arm re-used: only the safety member is broken or damaged in the overload condition.

The nature of the material of the safety member determines, in combination with the amount of weakness provided at the point of weakness, the overload condition which will result in the failure or break of the safety member. The nature of the material, and the structure of the safety member, means the safety member itself provides a natural hinge for the support arm in an overload condition. The threshold of force at which the overload condition occurs will be implementation or design dependent.

It will be understood by one skilled in the art that the principles of the invention, and embodiments described herein, are not limited to any specific interactive display system. The principles of the invention and its embodiments may be implemented in any interactive display system. The invention and its embodiments applies to any type of interactive surface technology being provided for the interactive display surface.

The invention and its embodiments advantageously apply to an integrated interactive display system comprising an electronic whiteboard for use in an educational environment. However one skilled in the art will appreciate that the invention is not limited to an educational application. One skilled in the art will envisage other possible applications.

The invention has been described herein by way of reference to particular examples and exemplary embodiments. One skilled in the art will appreciate that the invention is not limited to the details of the specific examples and exemplary embodiments set forth. Numerous other embodiments may be envisaged without departing from the scope of the invention, which is defined by the appended claims.

The invention claimed is:

1. An interactive whiteboard system including a display surface and a projector, wherein a support structure includes a support arm which extends away from the plane display surface, wherein there is further provided a safety member for connecting the support arm to the support structure, the safety member being arranged such that in an overload condition of the support arm, the support arm pivots relative to the support structure in a controlled manner until a predetermined stop point is reached, wherein the safety member is provided with a point of weakness at the position where it joins the support structure, the point of weakness becoming broken by breaking in the overload condition, wherein the safety member comprises a tubular structure, wherein in the overload condition the point of weakness breaks as a result of a break in a material of the tubular structure.

2. The interactive whiteboard system of claim 1 wherein a portion of the tubular structure opposite the point of weakness provides a hinge in the overload condition.

3. The interactive whiteboard system of claim 2 wherein the point of weakness is provided at an upper surface of the tubular structure, and the hinge is provided at a lower surface of the tube.

4. The interactive whiteboard system of claim 3 wherein the one end of the tubular structure is connected to the support structure and the other end of the tubular structure is connected to the support arm, wherein in the overload condition the point of weakness breaks such that the portion of the tube connected to the support arm pivots about the hinge downwardly, and the support arm connected thereto pivots downwardly.

5. The interactive whiteboard system of claim 1, wherein the safety member is provided with opposing first and second abutment edges about the point of weakness, wherein in the overload condition one portion of the safety member pivots relative to another portion of the safety member until the opposing abutment edges engage, the engagement of the abutment edges defining a stop condition.

6. The interactive whiteboard system of claim 5 wherein the first and second abutment edges are disposed at an angle with respect to each other, the angle defining a range of movement of the support arm in the overload condition.

7. The interactive whiteboard system of claim 4, wherein the safety member is provided with opposing abutment edges about the point of weakness, wherein in the overload condition one portion of the safety member pivots relative to another portion of the safety member until the opposing abutment edges engage, the engagement of the abutment edges defining a stop condition, wherein the pair of opposing abutment edges is provided on either one or both sides of the tubular structure wherein in a non-overload condition the opposing edges are separated, and in the overload condition the opposing edges move toward each other about the hinge and engage in a stop position, wherein the stop position defines the final position of the support arm in the overload condition.

8. The interactive whiteboard system of claim 1 wherein in the overload condition, as the support arm pivots about the hinge, sidewalls of the tubular structure tear in a line between the point of weakness on an upper surface and the hinge on a lower surface.

9. The interactive whiteboard system of claim 1, wherein the safety member comprises a part of the support arm.

10. The interactive whiteboard system of claim 1, wherein the support structure comprises a frame having a portion for connecting to the safety member, such that the safety member joins the frame to the support arm.

11. The interactive whiteboard system of claim 10 wherein the frame includes a further support arm which extends away from the plane of the display surface, the safety member joining the support arm and the further support arm.

12. The interactive whiteboard system of claim 1, wherein the support structure includes a mounting structure for connecting the safety member to a wall such that the safety member joins the support arm to the wall.

13. The interactive whiteboard system of claim 1, wherein the point of weakness is provided by a saw-cut to a portion thereof.

* * * * *